United States Patent
Hata et al.

(10) Patent No.: US 8,766,318 B2
(45) Date of Patent: Jul. 1, 2014

(54) SEMICONDUCTOR WAFER, METHOD OF MANUFACTURING A SEMICONDUCTOR WAFER, AND ELECTRONIC DEVICE

(75) Inventors: Masahiko Hata, Tsuchiura (JP); Tomoyuki Takada, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 388 days.

(21) Appl. No.: 12/920,455

(22) PCT Filed: Feb. 27, 2009

(86) PCT No.: PCT/JP2009/000920
§ 371 (c)(1),
(2), (4) Date: Aug. 31, 2010

(87) PCT Pub. No.: WO2009/110207
PCT Pub. Date: Sep. 11, 2009

(65) Prior Publication Data
US 2011/0006343 A1   Jan. 13, 2011

(30) Foreign Application Priority Data
Mar. 1, 2008   (JP) .................................. 2008-051448

(51) Int. Cl.
*H01L 29/12*   (2006.01)
(52) U.S. Cl.
USPC ...... 257/183; 257/190; 257/613; 257/E21.09; 257/E29.068; 257/E29.094
(58) Field of Classification Search
None
See application file for complete search history.

(56) References Cited

U.S. PATENT DOCUMENTS

| | | | |
|---|---|---|---|
| 4,551,394 A * | 11/1985 | Betsch et al. | 428/641 |
| 5,158,907 A | 10/1992 | Fitzgerald, Jr. | |
| 6,500,257 B1 * | 12/2002 | Wang et al. | 117/95 |
| 7,012,314 B2 * | 3/2006 | Bude et al. | 257/431 |
| 2004/0121507 A1 | 6/2004 | Bude et al. | |
| 2004/0157412 A1 | 8/2004 | Seifert | |
| 2007/0187668 A1 * | 8/2007 | Noguchi et al. | 257/19 |
| 2008/0153267 A1 * | 6/2008 | Clavelier et al. | 438/481 |
| 2009/0224285 A1 * | 9/2009 | Han et al. | 257/183 |

FOREIGN PATENT DOCUMENTS

| | | |
|---|---|---|
| JP | 04-084418 A | 3/1992 |
| JP | 04-233720 A | 8/1992 |
| JP | 08-316152 A | 11/1996 |

(Continued)

OTHER PUBLICATIONS

Office Action issued Jan. 5, 2012, in Chinese Patent Application No. 200980105610.5 with English translation.

(Continued)

*Primary Examiner* — Minh-Loan T Tran
*Assistant Examiner* — Fazli Erdem
(74) *Attorney, Agent, or Firm* — Sughrue Mion, PLLC

(57) ABSTRACT

The objective is to improve capabilities such as high-speed switching of a compound semiconductor device. Provided is a semiconductor wafer comprising a silicon wafer; an insulating film that is formed on the silicon wafer and that has an open portion reaching the silicon wafer; a Ge crystal formed in the open portion; a seed compound semiconductor crystal that is grown with the Ge crystal as a nucleus and that protrudes beyond a surface of the insulating film; and a laterally grown compound semiconductor layer that is laterally grown on the insulating film with a specified surface of the seed compound semiconductor crystal as a seed surface.

28 Claims, 16 Drawing Sheets

(56) References Cited

FOREIGN PATENT DOCUMENTS

| JP | 2000-021771 A | 1/2000 |
|---|---|---|
| JP | 2004-281869 A | 10/2004 |
| JP | 2004-531889 A | 10/2004 |
| JP | 2006-513584 A | 4/2006 |
| JP | 2007-21771 A | 2/2007 |
| WO | 02/090625 A1 | 11/2002 |
| WO | 2005/031827 A2 | 4/2005 |

OTHER PUBLICATIONS

J. Z. Li, et al., "Defect reduction of GaAs epitaxy on Si (001) using selective aspect ratio trapping," Applied Physics Letters, 2007, pp. 021114-021114-3, vol. 91.

H. Luan, et al., "High-quality Ge epilayers on Si with low threading-dislocation densities," Applied Physics Letters, Nov. 8, 1999, pp. 2909-2911, vol. 75, No. 19.

W.E. McMahon, et al., "An STM and LEED study of MOCVD-prepared P/Ge (100) to (111) surfaces," Surface Science, 2004, pp. 146-156, vol. 571.

B-Y. Tsaur, et al., "Low-dislocation-density GaAs epilayers grown on Ge-coated Si substrates by means of lateral epitaxial overgrowth," Appl. Phys. Lett., Aug. 15, 1982, pp. 347-349, vol. 41, No. 4.

Handbook for Electronics, Information and Communication Engineers vol. 1â, Institute of Electronics, Information, and Communication Engineers, Ohmsha publishing, 1988, p. 751.

Japanese Office Action issued in application No. 2009-243838 mailed Aug. 27, 2013.

K. Yamaguchi et al, "Lateral Growth of GaAs over SiOa Films Prepared on (111)B Substrates by Metalorganic Chemical Vapor Deposition", Japanese Journal of Applied Physics, vol. 28, No. 4, Apr. 1989, pp. 685-689.

Ji-Soo Park et al., "Defect Reduction and Its Mechanism for Selective Ge Epitaxy on Si(001) Using Aspect Ratio Trapping (ART™)", MRS Spring 2007.

H. Asai, "Anisotropic lateral growth in GaAs MOCVD layers on (001) substrates", Journal of Crystal Growth 80 (1987) 425-433.

\* cited by examiner

SEMICONDUCTOR WAFER, METHOD OF MANUFACTURING A SEMICONDUCTOR WAFER, AND ELECTRONIC DEVICE

CROSS REFERENCE TO RELATED APPLICATIONS

This application is a National Stage of International Application No. PCT/JP2009/000920 filed Feb. 27, 2009, claiming priority based on Japanese Patent Application No. 2008-051448, filed Mar. 1, 2008, the contents of all of which are incorporated herein by reference in their entirety.

TECHNICAL FIELD

The present invention relates to a semiconductor wafer, a method of manufacturing a semiconductor wafer, and an electronic device. In particular, the present invention relates to a semiconductor wafer, a method of manufacturing a semiconductor wafer, and an electronic device including a compound semiconductor crystal thin film having good crystallinity formed on an insulating film using an inexpensive silicon wafer.

BACKGROUND ART

Various types of high-performance electronic devices are being developed that use heterojunctions in electronic devices therein made of compound semiconductor crystals such as GaAs. Since the capabilities of these high-performance electronic devices are influenced by the crystallinity of the compound semiconductor crystal included therein, high-quality compound semiconductor crystals are desired. The need for lattice matching at the heterointerfaces in thin film crystal growth for manufacturing electronic devices using GaAs-based compound semiconductor crystals leads to the selection of wafers made of GaAs or of materials such as Ge whose lattice constant is very close to that of GaAs.

Patent Document 1 discloses a semiconductor device that has sections that restrict epitaxial regions grown on a non-matching wafer or a wafer with a high dislocation defect density. Non-Patent Document 1 describes a GaAs epitaxial layer with low dislocation density formed on a Ge-coated Si wafer using lateral epitaxial overgrowth.

Patent Document 1: Japanese Patent Application Publication No. 4-233720

DISCLOSURE OF THE INVENTION

Problems to be Solved By the Invention

When manufacturing GaAs-based electronic devices, lattice matching is considered and a GaAs wafer or a wafer that can achieve lattice matching with GaAs, such as a Ge wafer, is selected, us described above. However, GaAs wafers or wafers such as Ge wafers that can achieve lattice matching with GaAs are expensive, and this increases the overall cost of the device. Furthermore, these wafers do not have sufficient heat dissipation characteristics, and this might result in limitations such as restrictions on the formation density of the devices in order to achieve a reliable thermal design or only using the devices in a temperature range for which heat dissipation can be achieved. Accordingly, there is a demand for a semiconductor wafer that can be manufactured using an inexpensive Si wafer with good heat dissipation characteristics and that has a high-quality GaAs-type crystal thin film. One example of a GaAs epitaxial layer with low dislocation density formed on a Ge-coated Si wafer using lateral epitaxial overgrowth is described in B. Y. Tsata, ct al. "Low-dislocation-density GaAs epilayers grown on Ge-coated Si substrates by means of lateral epitaxial overgrowth," Appl. Physics Lett. 41(4)347-349, Aug. 15, 1982.

However, a sufficiently high-quality semiconductor wafer formed using an Si wafer and having a crystal thin film made of a compound semiconductor such as GaAs has yet to be achieved. A semiconductor wafer having good crystallinity is desired to achieve a high-performance electronic device.

Means for Solving the Problems

In order to solve the above problems, the inventors created the present invention as a result of rigorous examination. According to a first embodiment of the present invention, provided is a semiconductor wafer comprising a silicon wafer; an insulating film that is formed on the silicon wafer and that has an open portion reaching the silicon wafer; a Ge crystal formed in the open portion; a seed compound semiconductor crystal that is grown with the Ge crystal as a nucleus and that protrudes beyond a surface of the insulating film; and a laterally grown compound semiconductor layer that is laterally grown on the insulating film with a specified surface of the seed compound semiconductor crystal as a seed surface.

According to a second embodiment of the present invention, provided is a semiconductor wafer comprising a silicon wafer; a Ge crystal that is formed by etching a Ge film deposited on the silicon wafer; an insulating film that is limned on the silicon wafer in a region other than a region in which the Ge crystal is formed; a seed compound semiconductor crystal that is grown with the Ge crystal as a nucleus and that protrudes beyond a surface of the insulating film; and a laterally grown compound semiconductor layer that is laterally grown on the insulating film with a specified surface of the seed compound semiconductor crystal as a seed surface.

In the first embodiment, the open portion can have an aspect ratio of √3/3 or more. The aspect ratio can be 1 or more when the surface orientation of the silicon wafer is (100), can be √2 (approximately 1,414) or more when the surface orientation of the silicon wafer is (111), and can be √3/3 (approximately 0.577) or more when the surface orientation of the silicon wafer is (110).

The aspect ratio of the open portion refers to a value obtained by dividing the depth of the open portion by the width of the open portion. This Specification uses the technical definition of "aspect ratio" as described in "Handbook for Electronics, Information and Communication Engineers Vol. 1," Institute of Electronics, Information, and Communication Engineers, Ohmsha publishing, 1988, pg, 751, where the aspect ratio is defined as "etching depth/pattern width." The depth of the open portion is in the layering direction when layers fire formed on the silicon wafer, and the width of the open portion is in a direction perpendicular to the layering direction. If the open portion has a plurality of widths, the smallest width is used when calculating the aspect ratio. For example, when the shape of the open portion as seen in the direction of the layering is a rectangle, the length of a short side of the rectangle is used to calculate the aspect ratio.

The shape of the open portion as seen in the direction of the layering may be any shape, examples of which include a square, a rectangle, a strips, a circle, and an oval. When the shape is a circle or an oval, the width of the open portion is respectively the diameter and the shortest diameter. Furthermore, the open portion may have any cross-sectional shape in the direction of the layering, examples of which include a rectangular shape, a parabolic trapezoid shape, and a hyperbolic shape. If the cross-sectional shape is a trapezoid, the width of the open portion is whichever is the smallest of the width at the bottom thereof and the width at the top thereof.

If the shape of the open portion as seen in the layering direction is a rectangle or a square and the cross-sectional shape in the layering direction is rectangular, the stereoscopic shape in the open portion can be regarded as a rectangular parallelepiped. However, the stereoscopic shape within the open portion may be any shape, and when calculating the aspect ratio for an open region with an arbitrary stereoscopic shape, this shape may be approximated as a rectangular parallelepiped.

In the first embodiment or the second embodiment, maximum width of the Ge crystal in a direction parallel to a surface of the silicon wafer can be no greater than 5 µm. The Ge crystal or the seed compound semiconductor crystal may be annealed to have decreased defect density. The annealing may have one or more stages. The silicon wafer and the Ge crystal may be in contact with each other, and the silicon wafer may include therein an $Si_{1-x}Ge_x$ layer (0<x<1) that contacts an interlace between the silicon wafer and the Ge crystal. In this case, average composition x of Ge in a region that is from 5 nm to 10 nm away from the interface between the silicon wafer and the Ge crystal may be 60% or more.

In the first embodiment or the second embodiment, the seed compound semiconductor crystal may include a first seed compound semiconductor that is formed on the Ge crystal to protrude beyond the surface of the insulating film and a second seed compound semiconductor that is laterally grown on the insulating film with a specified surface of the first seed compound semiconductor as a nucleus, and the seed surface may be a specified surface of the second seed compound semiconductor. The laterally grown compound semiconductor layer may include defect regions that contain defects, and arrangement of the defect regions may be controlled by defect cores formed at prescribed intervals on the insulating film or on the seed surface.

In the first embodiment or the second embodiment, the laterally grown compound semiconductor layer may include delect regions that contain defects, and arrangement of the defect regions may be controlled by forming a plurality of the Ge crystals at prescribed intervals. A plurality of the Ge crystals may be formed on the silicon wafer and a plurality of the laterally grown compound semiconductor layers may be crystal-grown with the Ge crystals as nuclei to he separated from each other on the insulating film. A group 3-5 compound semiconductor layer containing P may be formed between the Ge crystal and the seed compound semiconductor crystal. The laterally-grown compound semiconductor layer may include a group 2-6 compound semiconductor or a group 3-5 compound semiconductor. The seed compound semiconductor crystal may be formed after the surface of the Ge crystal is processed with a gas containing P, such as $PH_3$.

According to a third embodiment of the present invention, provided is a semiconductor wafer comprising a silicon wafer; an insulating film that covers a portion of the silicon wafer; a Ge crystal formed on a portion of the silicon wafer that is not covered by the insulating film; a seed compound semiconductor crystal that lattice matches or pseudo-lattice matches with the Ge crystal; and a compound semiconductor layer that is formed on the insulating film and lattice matches or pseudo-lattice matches with the seed compound semiconductor crystal.

According to a fourth embodiment of the present invention, provided is a semiconductor wafer comprising a silicon wafer; an insulating film that is formed on the silicon wafer and that has an opening therein that reaches the silicon wafer; a Ge crystal formed in the opening; a compound semiconductor crystal that is grown with the Ge crystal as a nucleus and that is formed to protrude beyond a surface of the insulating film; and a laterally grown compound semiconductor that is laterally grown on the insulating film with the compound semiconductor crystal as a seed.

According to a fifth embodiment of the present invention, provided is a semiconductor wafer comprising a silicon wafer; a Ge crystal that is formed by etching a Ge film deposited on the silicon wafer; an insulating film that is formed on the silicon wafer in a region other than a region in which the Ge crystal is formed; a compound semiconductor crystal that is grown with the Ge crystal as a nucleus and that protrudes beyond a surface of the insulating film; and a laterally grown compound semiconductor that is laterally grown on the insulating film with the compound semiconductor crystal as a seed.

According to a sixth embodiment of the present invention, provided is a semiconductor wafer obtained by forming an insulating film on a principal surface of a silicon wafer; forming, in the insulating film, an opening that passes therethrough in a direction substantially perpendicular to the principal surface of the wafer to expose the wafer; growing a Ge crystal to contact the wafer within the opening; crystal-growing a seed compound semiconductor crystal that protrudes beyond a surface of the insulating film with the Ge crystal as a nucleus, and laterally growing a laterally grown compound semiconductor on the insulating film with a specified surface of the seed compound semiconductor crystal as a seed surface.

According to a seventh embodiment of the present invention, provided is a semiconductor wafer obtained by forming an insulating film on a principal surface of a silicon wafer; forming, in the insulating film, an opening that passes therethrough in a direction substantially perpendicular to the principal surface of the wafer to expose the wafer; growing a Ge crystal to contact the wafer within the opening; crystal-growing a compound semiconductor crystal that protrudes beyond a surface of the insulating film with the Ge crystal as a nucleus; and laterally crystal-growing a laterally grown compound semiconductor on the insulating film with the compound semiconductor crystal as a seed.

According to an eighth embodiment of the present invention, provided is a semiconductor wafer comprising an insulating film that covers a portion of a silicon wafer, a compound semiconductor that serves at least as a nucleus for crystal growth; and a laterally grown compound semiconductor that is laterally grown at least on the insulating film with the compound semiconductor as a seed.

According to a ninth embodiment of the present invention, provided is a method of manufacturing a semiconductor wafer, comprising forming an insulating film on a silicon wafer; forming an open portion that reaches the silicon wafer in the insulating film; forming a Ge crystal in the open portion; forming a seed compound semiconductor crystal that protrudes beyond a surface of the insulating film, with the Ge crystal as a nucleus; and laterally growing a laterally grown compound semiconductor layer on the insulating film, with a specified surface of the seed compound semiconductor crystal as a seed surface.

According to a tenth embodiment of the present invention, provided is a method of manufacturing a semiconductor wafer, comprising forming a crystalline Ge Him on a silicon wafer; forming a Ge crystal by etching the Ge film; forming an insulating film in a region other than a region in which the Ge crystal is formed; forming a seed compound semiconductor crystal that protrudes beyond a surface of the insulating film, with the Ge crystal as a nucleus; and laterally growing a laterally grown compound semiconductor layer on the insulating film, with a specified surface of the seed compound semiconductor crystal as a seed surface.

In the ninth embodiment or the tenth embodiment, forming the seed compound semiconductor crystal may include forming on the Ge crystal a first seed compound semiconductor that protrudes beyond the surface of the insulating film; and laterally growing a second seed compound semiconductor on the insulating film, with a specified surface of the first seed compound semiconductor as a nucleus, and forming a specified surface of the second seed compound semiconductor as the seed surface. The method of the ninth embodiment or the tenth embodiment may further comprise forming delect cores at prescribed intervals on the seed surface of the seed compound semiconductor crystal, the seed surface of the second seed compound semiconductor, or the insulating film.

According to an eleventh embodiment of the present invention, provided is a method of manufacturing a semiconductor wafer, comprising forming an insulating film on a silicon wafer; forming an opening that reaches the silicon wafer in the insulating film; forming a Ge crystal in the opening; forming a compound semiconductor crystal that protrudes beyond a surface of the insulating film, with the Ge crystal us a nucleus; and laterally growing a laterally grown compound semiconductor on the insulating film, with the compound semiconductor crystal as a seed.

According to a twelfth embodiment of the present invention, provided is a method of manufacturing a semiconductor wafer, comprising forming a crystalline Ge film on a silicon wafer forming a Ge crystal by etching the Ge film; forming an insulating film in a region other than a region in which the Ge crystal is formed; forming a compound semiconductor crystal that protrudes beyond a surface of the insulating film, with the Ge crystal as a nucleus; and laterally growing a laterally grown compound semiconductor on the insulating film, with the compound semiconductor crystal as a seed.

According to a thirteenth embodiment of the present invention, provided is a method of manufacturing a semiconductor wafer, comprising forming, on a silicon wafer, an insulating film that covers a portion of the silicon wafer; forming, on the silicon wafer, a compound semiconductor that serves at least as a nucleus for crystal growth; and laterally growing a laterally grown compound semiconductor at least on the insulating film, with the compound semiconductor as a seed.

According to a fourteenth embodiment of the present invention, provided is an electronic device comprising a silicon wafer; an insulating film that is formed on the silicon wafer and that has an open portion reaching the silicon wafer; a Ge crystal formed in the open portion; a seed compound semiconductor crystal that is grown with the Ge crystal as a nucleus and that protrudes beyond a surface of the insulating film, a laterally grown compound semiconductor layer that is laterally grown on the insulating film with a specified surface of the seed compound semiconductor crystal as a seed surface; and an active element that has an active region and that is formed on a defect-free region of the laterally grown compound semiconductor layer.

According to a fifteenth embodiment of the present invention, provided is an electronic device comprising: a silicon wafer; a Ge crystal that is formed by etching a Ge film deposited on the silicon wafer; an insulating film that is formed on the silicon wafer in a region other than a region in which the Ge crystal is formed; a seed compound semiconductor crystal that is grown with the Ge crystal as a nucleus and that protrudes beyond a surface of the insulating film; a laterally grown compound semiconductor layer that is laterally grown on the insulating film with a specified surface of the seed compound semiconductor crystal as a seed surface; and an active element that has an active region and that is formed on a defect-free region of the laterally grown compound semiconductor layer.

In the fourteenth embodiment or the fifteenth embodiment, the active clement may have a first input/output electrode and a second input/output electrode, the laterally grown compound semiconductor layer above the open portion may be removed by etching, and the second input/output electrode may cover a side surface of the laterally grown compound semiconductor layer that is exposed by the etching. The second input/output electrode may be connected to the silicon wafer via the Ge crystal or the seed compound semiconductor crystal in the open portion exposed by the etching. The active element may have a first input/output electrode and a second input/output electrode, the laterally grown compound semiconductor layer in a region where the Ge crystal is formed may be removed by etching, and the second input/output electrode may cover a side surface of the laterally grown compound semiconductor layer that is exposed by the etching. The second input/output electrode may be connected to the silicon wafer via the Ge crystal or the seed compound semiconductor crystal exposed by the etching in the region where the Ge crystal is formed. The active element may have a first input/output electrode and a second input/output electrode, and the first input/output electrode may cover a growth surface of the laterally grown compound semiconductor layer. The active element may have control electrodes that control voltage or current between input and output, and the control electrodes may be formed (i) between the insulating film and the laterally grown compound semiconductor layer and (ii) on a side of the laterally grown compound semiconductor layer that is opposite the insulating film, in a manner to lace each other, A plurality of the active elements may be connected to each other. The silicon wafer and the Ge crystal may contact each other, and the silicon wafer may contain an $Si_{1-x}Ge_x$ layer ($0<x<1$) contacting an interface between the silicon wafer and the Ge crystal. In this case, average Ge composition x may be 60% or greater in a region that is between 5 nm and 10 nm away from the interface between the silicon wafer and die Ge crystal.

According to a sixteenth embodiment of the present invention, provided is an electronic device comprising a silicon wafer; an insulating film that is formed on the silicon wafer and that has an opening therein that reaches the silicon wafer; a Ge crystal formed in the opening; a compound semiconductor crystal that is grown with the Ge crystal as a nucleus and that is formed to protrude beyond a surface of the insulating film; a laterally grown compound semiconductor that is laterally grown on the insulating film with the compound semiconductor crystal as a seed; and an active element that has an active region on the laterally grown compound semiconductor.

According to a seventeenth embodiment of the present invention, provided is an electronic device comprising a silicon wafer; a Ge crystal that is formed by etching a Ge film deposited on the silicon -wafer; an insulating film that is formed on the silicon wafer in a region other than a region in which the Ge crystal is formed; a compound semiconductor crystal that is grown with the Ge crystal as a nucleus and that protrudes beyond a surface of the insulating film; a laterally grown compound semiconductor that is laterally grown on the insulating film with the compound semiconductor crystal as a seed; and an active element, that has an active region on the laterally grown compound semiconductor.

According to a eighteenth embodiment of the present invention, provided is an electronic device comprising an insulating film that covers a portion of a silicon wafer; a compound semiconductor that serves at least as a nucleus for crystal growth; a laterally grown compound semiconductor that is laterally grown at least on the insulating film with the compound semiconductor as a seed; and an active element that has an active region on the laterally grown compound semiconductor.

LIST OF REFERENCE NUMERALS

Figure 1:
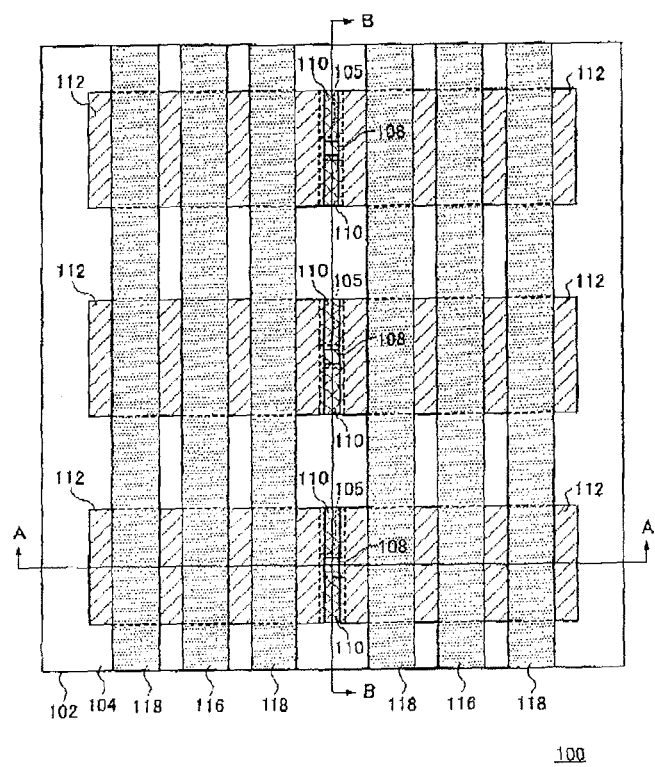
FIG. 1 is an exemplary planar view of an electronic device 100 according to an embodiment of the present invention.

100 Electronic device
102 Silicon wafer
104 Insulating film
105 Open portion
106 Ge crystal
108 First seed compound semiconductor
110 Second seed compound semiconductor
112 Laterally grown compound semiconductor layer
114 Gate insulating film
116 Gale electrode
118 Source/drain electrode
120 Defect region
130 Defect region
200 Electronic device
300 Electronic device
400 Electronic device
402 Buffer layer
500 Electronic device
502 Source/drain electrode
600 Electronic device
602 Source/drain electrode
700 Electronic device
702 Lower gate insulating film
704 Lower gate electrode

BEST MODE FOR CARRYING OUT THE INVENTION

Hereinafter, some embodiments of the present invention will be described. The embodiments do not limit the invention according to the claims, and all the combinations of the features described in the embodiments are not necessarily essential to means provided by aspects of the invention.

Figure 2:
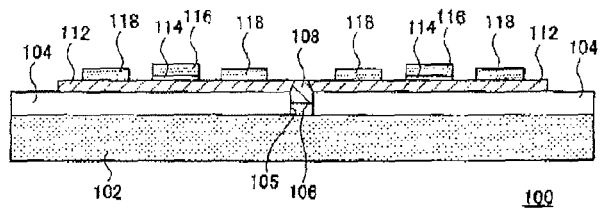
FIG. 2 is a cross-sectional view taken along the line A-A in FIG. 1.
Figure 3:
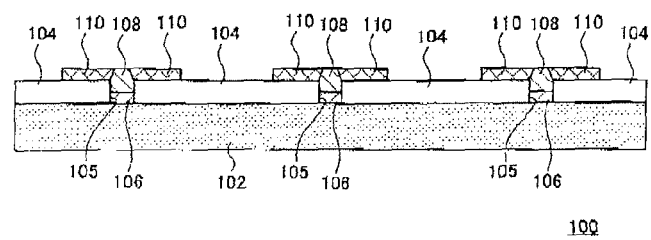
FIG. 3 is a cross-sectional view taken along the line B-B in FIG. 1.

FIG. 1 is an exemplary planar view of an electronic device 100 according to an embodiment of the present invention. FIG. 2 is a cross-sectional view taken along the line A-A in FIG. 1. FIG. 3 is a cross-sectional view taken along the line B-B in FIG. 1. The electronic device 100 of the present embodiment includes a silicon wafer 102, insulating films 104, Ge crystals 106, first seed compound semiconductors 108, second seed compound semiconductors 110, laterally grown compound semiconductor layers 112, gale insulating films 114, gate electrodes 116, and source/drain electrodes 118. The following describes, as an example of the electronic device 100, a device that includes a plurality of MOSFETs (metal-oxide-semiconductor field-effect transistors).

The silicon wafer 102 may be a commercially available silicon wafer, and MOSFETs or the like may be formed on the silicon wafer 102 as active elements. Since the silicon wafer 102 is used as the wafer in the present embodiment, the resulting electronic device 100 has favorable cost performance. Furthermore, since the silicon wafer 102 is used, heal, dissipation by the electronic device 100 can be easily managed.

Each insulating film 104 is formed on the silicon wafer 102 and includes an open portion 105 therein that reaches the silicon wafer 102. This "open portion" may be referred to as an "opening," and the open portion 105 is an example of an opening. The insulating film 104 functions as an inhibiting layer that inhibits epitaxial growth. In other words, by forming the open portion 105 that reaches the silicon wafer 102 in the insulating film 104, epitaxially grown film can be deposited selectively within the open portion 105 that exposes the silicon, and the epitaxial film can be prevented from being grown on the insulating film 104.

Each insulating film 104 may be a silicon oxide film or a silicon nitride film, for example. After the Ge crystals 106 are formed, the insulating films 104 may be formed in regions in which the Ge crystals 106 are not formed. For example, the insulating films 104 may be formed by selective oxidation of the silicon wafer 102 with the Ge crystals 106 as a mask.

The insulating films 104 may be formed separately from each other on the silicon wafer 102. That is, a plurality of insulating films 104 may be formed on the silicon wafer 102. As a result, the silicon wafer 102 is exposed between the insulating films 104, and the exposed portions of the silicon wafer 102 function as adsorbing sections. The adsorbing sections are regions that adsorb the film growth precursor during epitaxial growth, and stabilize the film deposition rate during epitaxial growth. When the insulating films 104 are separated from each other, the distance between adjacent insulating films 104 is preferably between 20 µm and 500 µm. As a result of experimentation by the present inventors, a stable epitaxial growth rate was achieved by arranging the insulating films 104 separated by the above distances. One or more of the open portions 105 may be formed in each insulating film 104. The plurality of insulating films 104 may be formed on the silicon wafer 102 at uniform intervals.

The Ge crystals 106 are formed on (be silicon wafer 102 at the bottoms of the open portions 105. When the Ge crystals 106 are formed in the open portions 105 of the insulating films 104, the Ge crystals 106 can be formed by being selectively grown in the open portions 105. Instead, the Ge crystals 106 may be formed by using photolithography to etch the Ge crystals 106 from a Ge film formed on the surface of the silicon wafer 102.

The Ge crystals 106 may be single crystals or polycrystals, and provide a crystal nucleus of the first seed compound semiconductor 108. The Ge crystals 106 formed in the open portions 105 may undergo annealing to decrease the defect density thereof. This annealing may be multi-stage annealing. The surfaces of the Ge crystals 106 may be processed with a gas containing P, such as $PH_3$ (phosphine). In such a case, the crystallinity of the films formed on the Ge crystals 106 can be improved.

The Ge crystals 106 may be annealed at a temperature no greater than 900° C., preferably 850° C. or lower. As a result, the surfaces of the Ge crystals 106 can be kept flat. According to results of experimentation by the present inventors, the favorable flatness is achieved when the annealing temperature is lower. The flatness of the surfaces of the Ge crystals 106 is particularly important when forming other layers on the surfaces of the Ge crystals 106. The Ge crystals 106 may he annealed at a temperature no less than 680° C., preferably 700° C. or higher. As a result, the density of the crystal defects in the Ge crystals 106 can be decreased. According to the above description, the Ge crystals 106 may be annealed at a temperature between 680° C. and 900° C., preferably between 700° C. and 850° C.

The Ge crystals 106 may be annealed in an ambient atmosphere, a nitrogen atmosphere, an argon atmosphere, or a hydrogen atmosphere. In particular, by annealing the Ge crystals 106 in an atmosphere that includes hydrogen, the surfaces of the Ge crystals 106 can be maintained in a smooth state while decreasing the density of crystal defects therein. The Ge crystals 106 may be annealed with a temperature and duration that enables movement of crystal defects The crystal defects in the Ge crystals 106 move therein during the annealing, and are trapped in the interfaces between the Ge crystals 106 and the insulating films 104. in the surfaces of the Ge crystals 106, or in gettering sinks within the Ge crystals 106. for example. As a result, the crystal defects near the surfaces of the Ge crystals 106 can be expelled.

In the region where the silicon wafer 102 contacts the Ge crystals 106, an $Si_{1-x}Ge_x$ layer ($0<x<1$) may be included in the silicon wafer 102 to contact the interface between the silicon wafer 102 and the Ge crystals 106. In other words, an SiGe layer may be formed by diffusing in the silicon wafer 102 the Ge particles within the Ge crystals 106. In such a case, the crystallinity of the epitaxial layers formed on the Ge crystals 106 can be improved. The average Ge composition x in the $Si_{1-x}Ge_x$ layer can be 60% or greater in a region that is between 5 nm and 10 nm away from the interface between the silicon wafer 102 and the Ge crystals 106. In such a case, the crystallinity of the epitaxial layers formed on the Ge crystals 106 can be improved even further.

The aspect ratio of each open portion 105 can be greater than or equal to $\sqrt{3}/3$. In particular, when the surface orientation of the silicon wafer 102 is (100), the aspect ratio is preferably no less than 1, and when the surface orientation of the silicon wafer 102 is (111), the aspect ratio is preferably no less than $\sqrt{2}$, which is approximately 1.414. When the surface orientation of the silicon wafer 102 is (110), the aspect ratio is preferably no less than $\sqrt{3}/3$, which is approximately 0.577.

When Ge is selectively grown in an open portion 105 whose aspect, ratio is no less than $\sqrt{3}/3$ to form a Ge crystal 106 with a certain thickness, the crystal defects of this Ge crystal 106 terminate at the walls of the open portion 105. Therefore, the Ge crystal 106 formed within the open portion 105 has good crystallinity in the upper portion thereof. The Ge crystal 106 in an open portion 105 can become the crystal nucleus of the first seed compound semiconductor 108, and so a Ge crystal 106 having good crystallinity at least on the surface thereof can improve the crystallinity of the first seed compound semiconductor 108. The maximum width, in a direction parallel to the surface of the silicon wafer 102, of each Ge crystal 106 formed in an open portion 105 can be no greater than 5 µm and no less than 2 µm.

The first seed compound semiconductors 108 are formed to protrude from the Ge crystals 106 beyond the surfaces of the insulating films 104. In other words, the first seed compound semiconductors 108 are formed in the regions where the Ge crystals 106 are formed, i.e. in the open portions 105, and the tops of the first seed compound semiconductors 108 are formed higher than the surfaces of the insulating films 104. Instead, the tops of the first seed compound semiconductors 108 may protrude from the surfaces of the insulating films 104. The portion protruding from the surface of each insulating film 104 has a specified surface formed thereon to serve as the seed surface. When the surface orientation of the silicon wafer 102 is (100) and an open portion 105 is formed in a <001> direction, the seed surface of the first seed compound semiconductor 108 is a (110) surface and any surface equivalent thereto. When forming an open portion 105 in a <011> direction, the seed surface of the first seed compound semiconductor 108 is a (111) A surface and any surface equivalent thereto.

Each first seed compound semiconductor 108 is crystal-grown with the surface of the Ge crystal 106 within the open portion 105 serving as the crystal nucleus, and this specified surface provides a seed surface that can serve as the crystal nucleus of the second seed compound semiconductor 110.

The first seed compound semiconductors 108 with good crystallinity provide seed surfaces with good crystallinity, and so the second seed compound semiconductors 110 that are crystal-grown with these seed surfaces as crystal nuclei have improved crystallinity.

The first seed compound semiconductors 108 may be compound semiconductors from group 4, group 3-5, or group 2-6 that lattice match or pseudo-lattice match with Ge, examples of which include GaAs, InGaAs, and SiC. Pseudo-lattice matching means that there is only a small difference between the lattice constants of the two semiconductor layers in contact with each other, and so, although this is not complete lattice matching, the lattice matching is close enough that, the occurrence of defects due to lattice mismatching is negligible, and so these two contacting semiconductor layers can be considered to be in a layered state. For example, the layered state of the Ge layer and the GaAs layer can be considered as pseudo-lattice matching.

An intermediate layer may be arranged between the Ge crystals 106 and the first seed compound semiconductors 108. This intermediate layer may be a single layer or may include a plurality of layers. The intermediate layer may be formed at a temperature no greater than 600° C., preferably no greater than 550° C. As a result, the crystallinity of the first seed compound semiconductors 108 can be improved. The intermediate layer may be formed at a temperature no less than 400° C. The intermediate layer may be formed at a temperature between 400° C. and 600° C., inclusive. As a result, the crystallinity of the first seed compound semiconductors 108 can be improved. The intermediate layer may be a GaAs layer formed at a temperature no greater than 600° C., preferably no greater than 550° C.

The second seed compound semiconductors 110 are laterally grown on the insulating films 104, with the specified surfaces of the first seed compound semiconductors 108 serving as the crystal nuclei. The second seed compound semiconductors 110 may be compound semiconductors from group 4, group 3-5, or group 2-6 that lattice match or pseudo-lattice match with the specified surfaces of the first seed compound semiconductors 108, examples of which include GaAs, InGaAs, and SiC. The specified surfaces of the second seed compound semiconductors 110 provide seed surfaces that can serve as the crystal nuclei of the laterally grown compound semiconductor layers 112. Since the second seed compound semiconductors 110 have improved crystallinity as described above, the second seed compound semiconductors 110 can provide seed surfaces with good crystallinity.

The first seed compound semiconductors 108 and the second seed compound semiconductors 110 can be regarded as integrally forming seed compound semiconductor crystals. Specifically, the first seed compound semiconductors 108 and the second seed compound semiconductors 110 may be compound semiconductor crystals grown using the Ge crystals 106 as nuclei, and may be seed compound semiconductor crystals formed to protrude further than the surfaces of the insulating films 104. The seed compound semiconductor crystals may be selectively grown within open portions 105 that are formed in the insulating films 104 and whose aspect ratios are no less than $\sqrt{3}/3$. The seed compound semiconductor crystals may undergo multi-stage annealing, for example, to decrease the defect density.

The laterally grown compound semiconductor layers 112 are laterally grown on the insulating films 104, with the specified surfaces of the second seed compound semiconductors 110 or the seed compound semiconductor crystals serving as the seed surfaces. Since the laterally grown compound semiconductor layers 112 are crystal-grown with the specified surfaces of the second seed compound semiconductors 110 or the seed compound semiconductor crystals having good crystallinity serving as the seed surfaces, the resulting semiconductor layers have good crystallinity. Therefore, the laterally grown compound semiconductor layers 112 include defect-free regions. The laterally grown compound semiconductor layers 112 may include group 2-6 compound semiconductors or group 3-5 compound semiconductors. GaAs layers are an example of the laterally grown compound semiconductor layers 112. Here, the "defect-free region" refers to a region that does not include dislocation, such as edge dislocation and screw dislocation, occurring when layering crystals having different properties, such as lattice constants and thermal expansion coefficients. In addition to regions that include absolutely no defects, the defect-free regions may be regions with lower defect density than defect regions.

When a silicon wafer 102 having a (100) surface as a principal surface is used and a compound semiconductor is laterally grown on the (100) surface of the silicon wafer 102, the compound semiconductor is more easily grown in the <011> direction of the silicon wafer 102 than in the <0-11> direction. When growing the compound semiconductor in the <0-11> direction of the silicon wafer 102, a (111) B surface of the compound semiconductor appears on an end surface of the laterally grown compound semiconductor. This (111) B surface is stable, and can therefore be easily formed as a flat surface. Accordingly, an electronic device is formed by forming a gate insulating film, a source electrode, a gate electrode, and a gain electrode on the (111) B surface of the compound semiconductor.

When laterally growing the compound semiconductor in the <011> direction of the silicon wafer 102, the (111) B surface of the compound semiconductor appearing on an end surface of the laterally-grown compound semiconductor faces the opposite direction. In this case, the upper portion of the (100) surface can be widened so that the electronic device can be formed on the (100) surface. If there is high arsinc pressure, the compound semiconductor can be laterally grown in both the <010> direction and the <001> direction of the silicon wafer 102. When grown in these directions, a (110) surface or a (101) surface of the compound semiconductor is likely to appear on an end surface of the compound semiconductor. An electronic device can also be formed by forming a gate insulating film, a source electrode, a gate electrode, and a gain electrode on the (110) surface or the (101) surface of the compound semiconductor.

The silicon wafer 102, the insulating films 104, the Ge crystals 106, the first seed compound semiconductors 108, the second seed compound semiconductors 110, and the laterally grown compound semiconductor layers 112 described above can be understood as the components of the semiconductor wafer. Expressed in different terms, the semiconductor wafer includes the silicon wafer 102, insulating films 104 covering a portion of the silicon wafer 102, Ge crystals 106 formed on the portion of the silicon wafer 102 that is not covered by the insulating films 104, seed compound semiconductor crystals that lattice match or pseudo-lattice match with the Ge crystals 106, and compound semiconductor layers that are formed on the insulating films 104 and lattice match or pseudo-lattice match with the seed compound semiconductor crystals. The seed compound semiconductor crystals can include the first seed compound semiconductors 108 and the second seed compound semiconductors 110, and the compound semiconductor layers may be the laterally grown compound semiconductor layers 112.

Active elements having active regions can be formed on the defect-free regions of the laterally grown compound semiconductor layers 112. The active elements may be MOSFETs that each include a gate insulating film 114, a gate electrode 116, and a source/drain electrode 118. The MOSFETs may instead be MISFETs (Metal-Insulator-Semiconductor Field-Effect Transistors).

Each gate insulating film 114 electrically insulates the gate electrode 116 from the laterally grown compound semiconductor layer 112. The gate insulating films 114 may be silicon oxide films, silicon nitride films, or aluminum oxide films, for example.

The gate electrodes 116 are examples of control electrodes. Each gate electrode 116 controls the current or voltage between input and output, which is exemplified here as the source and drain. The gate electrodes 116 may be semiconductors made of metals such as aluminum, copper, gold, silver, platinum, tungsten, etc. or of highly doped silicon, for example.

The source/drain electrodes 118 are examples of input/output electrodes. Each source/drain electrode 118 contacts a source region and a drain region. The source/drain electrodes 118 may be semiconductors made of metals such as aluminum, copper, gold, silver, platinum, tungsten, etc. or of highly doped silicon, for example.

Although not shown, source and drain regions are formed below each source/drain electrode 118. A channel layer formed below each gate electrode 116 and having a channel region between the source region and the drain region may be a laterally-grown compound semiconductor layer 112, or may be a layer formed on top of the laterally grown compound semiconductor layer 112. Buffer layers may be formed between the laterally grown compound semiconductor layers 112 and the channel layers. The channel layers or the buffer layers may be GaAs layers, InGaAs layers, AlGaAs layers, GaN layers, InGaP layers, or ZnSe layers, for example.

The electronic device 100 shown in FIG. 1 includes six MOSFETs. Among these six MOSFETs, three are connected to each other by the wiring of the gate electrodes 116 and the source/drain electrodes 118. The laterally grown compound semiconductor layers 112, which are crystal-grown using the Ge crystals 106 formed on the silicon wafer 102 as nuclei, may be separated from each other on the insulating films 104.

Since the laterally grown compound semiconductor layers 112 are separated from each other, interfaces are not formed between adjacent laterally grown compound semiconductor layers 112, and so crystal defects occurring at the interfaces need not be regarded as a problem. As long as the active elements formed on the laterally grown compound semiconductor layers 112 exhibit good crystallinity in the active layers thereof, problems do not occur when the laterally grown compound semiconductor layers 112 are formed separately. If an increase in the drive current of each active element is desired, it is sufficient to connect the active elements to each other in parallel as shown in the present embodiment. In the electronic device shown in FIGS. 1 to 3, two MOSFETs are formed sandwiching each open portion 105, but instead, the two MOSFETs may be separated from each other by removing the compound semiconductor layer therebetween using etching or the like, or by deactivating the compound semiconductor layer using ion implantation or the like.

Figure 4:
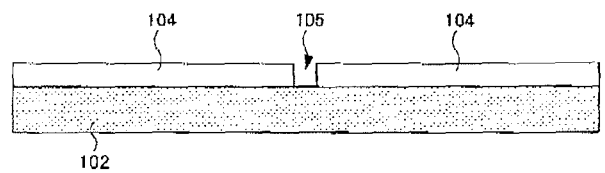
FIG. 4 is an exemplary cross-sectional view of a step for manufacturing the electronic device 100.

FIGS. 4 to 8 are exemplary cross-sectional views of steps for manufacturing the electronic device 100. As shown in FIG. 4, the insulating films 104 are formed on the silicon wafer 102, and an open portion 105 reaching the silicon wafer 102 is formed between the insulating films 104. The insulating films 104 can be formed by CVD (Chemical Vapor Deposition) or a sputtering technique, and the open portion 105 can be formed by photolithography.

Figure 5:
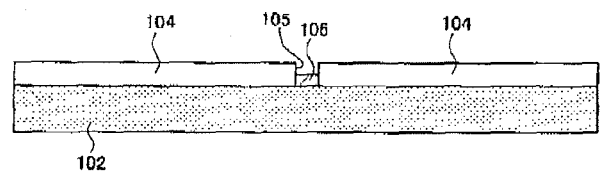
FIG. 5 is an exemplary cross-sectional view of a step for manufacturing the electronic device 100.

As shown in FIG. 5, a Ge crystal 106 is formed in the open portion 105. The Ge crystal 106 may be formed by epitaxial growth. The epitaxial growth may be achieved using methods such as MOCVD (Metal Organic Chemical Vapor Deposition) and MBE (Molecular Beam Epitaxy). The raw material gas may be GeI$_4$.

With the Ge crystal 106 as a nucleus, the seed compound semiconductor crystal is formed to extend further than the surfaces of the insulating films 104. In other words, the seed compound semiconductor crystal is formed to protrude beyond the surfaces of the insulating films 104. The formation or the seed compound semiconductor crystal is described below.

Figure 6:
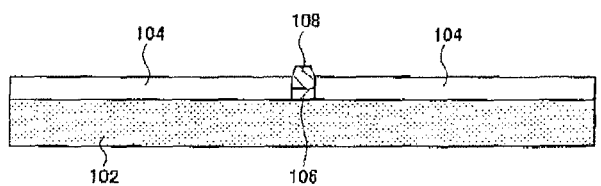
FIG. 6 is an exemplary cross-sectional view of a step for manufacturing the electronic device 100.

As shown in FIG. 6, with the Ge crystal 106 as a nucleus, the first seed compound semiconductor 108 is formed to extend further than the surfaces of the insulating films 104. When the first seed compound semiconductor 108 is formed of GaAs, for example, an epitaxial growth method using MOCVD or MBE can be used. In this case, the raw material gas may be TM-Ga (trimethylgallium), AsH$_3$ (arsine), or some other gas. The growth temperature may be between 600° C. and 650° C.

Next, the second seed compound semiconductor 110 is formed using a specified surface of the first seed compound semiconductor 108 as a seed surface. The cross-sectional view for this step is the same as shown in FIG. 3. When the second seed compound semiconductor 110 is formed of GaAs, for example, an epitaxial growth method using MOCVD or MBE can be used. In this case, the raw material gas may be TM-Ga (trimethylgallium), AsH$_3$ (arsinc), or some other gas. The growth temperature may be between 600° C. and 650° C.

Figure 7:
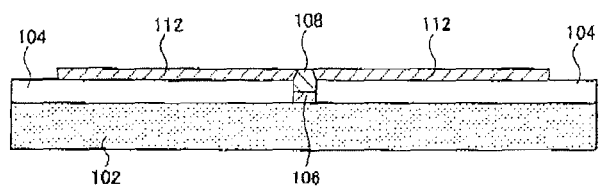
FIG. 7 is an exemplary cross-sectional view of a step for manufacturing the electronic device 100.

As shown in FIG. 7, the laterally grown compound semiconductor layers 112 are laterally grown on the insulating films 104, with the specified surfaces of the seed compound semiconductor crystals, i.e. the specified surfaces of the second seed compound semiconductor 110, serving as the seed surfaces. When the laterally grown compound semiconductor layers 112 are formed of GaAs, for example, an epitaxial growth method using MOCVD or MBF, can be used. In this case, the raw material gas may be TM-Ga (trimethylgallium), AsH$_3$ (arsine), or some other gas.

In order to accelerate the lateral growth when forming the laterally grown compound semiconductor layers 112 on the wafer with a (001) surface, low-temperature growth is preferably selected, specifically growth at a temperature no greater than 700° C., preferably no greater than 650° C. When the lateral growth is in the <110> direction, high AsH$_3$ pressure is preferably used, e.g. AsH$_3$ pressure of no less than 0.1 kPa As a result, the growth rate in the <110> direction is greater than the growth rate in the <-110>direction.

Figure 8:
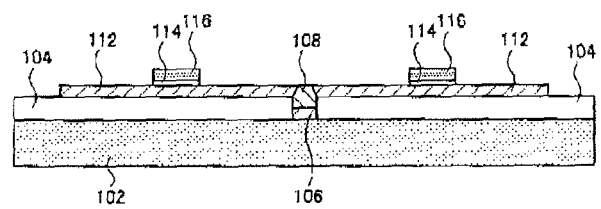
FIG. 8 is an exemplary cross-sectional view of a step for manufacturing the electronic device 100.

As shown in FIG. 8, an insulating film that becomes the gate insulating films 114 and a conductive film that becomes the gate electrodes 116 are sequentially formed on the laterally grown compound semiconductor layers 112, and the insulating film and conductive film are patterned using photolithography, for example. As a result, the gate insulating films 114 and the gate electrodes 116 are formed. After this, a conductive film that becomes the source/drain electrodes 118 is formed and then patterned using photolithography, for example, to manufacture the electronic device 100 shown in FIG. 2.

Figure 9:
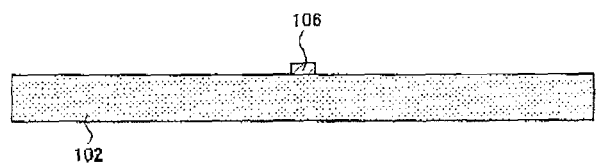
FIG. 9 is an exemplary cross-sectional view of a step in another method for manufacturing the electronic device 100.
Figure 10:
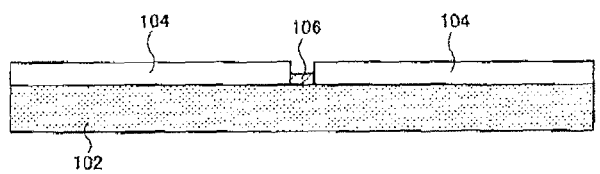
FIG. 10 is an exemplary cross-sectional view of a step in another method for manufacturing the electronic device 100.

FIGS. 9 and 10 are exemplary cross-sectional views of steps for manufacturing the electronic device 100 according to another manufacturing method. As shown in FIG. 9, a crystalline Ge film is formed on the silicon wafer 102 and is then etched such that only a portion thereof remains, thereby forming a Ge crystal 106 on the silicon wafer 102. The etching used here can be photolithography. The maximum width of the Ge crystal 106 in a direction parallel to the surface of the silicon wafer 102 is, for example, no greater than 40 µm, preferably no greater than 10 µm, more preferably no greater than 5 µm, and most preferably no greater than 2 µm.

As shown in FIG. 10, insulating films 104 are formed in the region where the Ge crystal 106 is not formed. Local oxidation using the Ge crystal 106 as an oxidation-preventing mask, for example, can be applied to the insulating films 104, The subsequent steps are the same as those described in FIG. 6 and onward.

With the electronic device 100 described above, since the Ge crystals 106 are formed in a partial region or since the Ge crystals 106 are formed in open portions 105 having aspect ratios no less than $\sqrt{3}/3$, the crystallinity of the Ge crystals 106 was increased. This improvement to the crystallinity of the Ge crystals 106 resulted in an increase in the crystallinity of the first seed compound semiconductors 108 having the Ge crystals 106 as nuclei and an increase in the crystallinity of the second seed compound semiconductors 110 having the specified surfaces of the first seed compound semiconductors 108 as seed surfaces. This in turn resulted in an increase in the crystallinity of the laterally grown compound semiconductor layers 112 having the specified surfaces of the second seed compound semiconductors 110 as seed surfaces. Accordingly, an increase in the crystallinity of the active layer of the electronic device formed on the laterally grown compound semiconductor layers 112 and an increase in the performance of the electronic device formed on the low-cost silicon wafer 102 were achieved.

Furthermore, in the electronic device 100 described above, the laterally grown compound semiconductor layers 112 are grown on the insulating films 104. fn other words, the electronic device 100 has the same configuration as an SOI (Silicon On Insulator). Accordingly, the floating capacitance of the electronic device 100 was decreased and the operational speed was improved. In addition, the leak current to the silicon wafer 102 was decreased.

Figure 11:
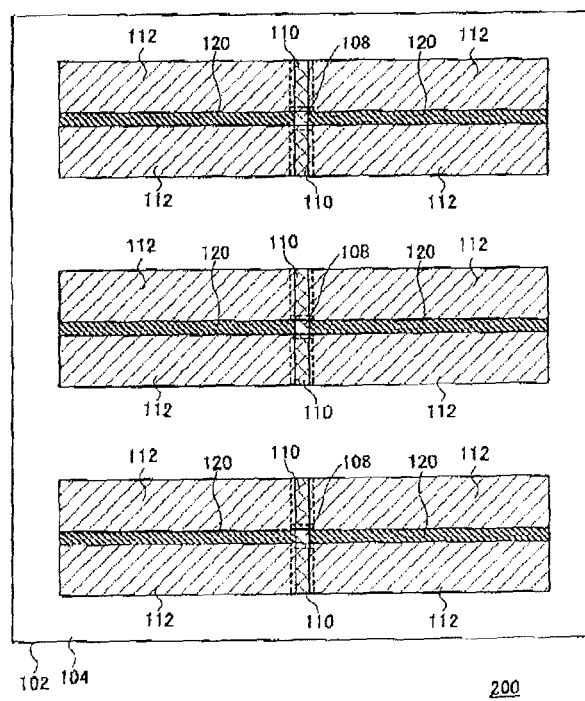
FIG. 11 is an exemplary planar view of an electronic device 200 according to another embodiment of the present invention.
Figure 12:
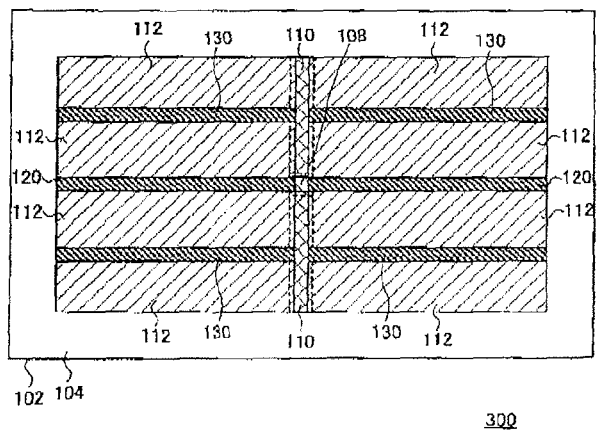
FIG. 12 is an exemplary planar view of an electronic device 300 according to another embodiment of the present invention.

FIG. 11 is an exemplary planar view of another electronic device 200 according to an embodiment of the present invention. In FIG. 11, the gate electrodes and the source/drain electrodes are omitted. In the electronic device 200, the laterally grown compound semiconductor layers 112 include defect regions 120 containing defects. The defect regions 120 are generated from the Ge crystals 106 and the open portions 105 in which the first seed compound semiconductors 108 are formed on the Ge crystals 106, and the arrangement thereof is controlled by forming the open portions 105 at prescribed intervals. Here, the prescribed intervals are designed according to the objective of the electronic device 200, and may include, for example, forming a plurality of open portions 105 at uniform intervals, forming the open portions 105 at regular intervals, and forming the open portions 105 at periodic intervals, FIG. 12 is an exemplary planar view of another electronic device 300 according to an embodiment of the present invention. In FIG. 12, the gate electrodes and the source/drain electrodes are omitted. In the electronic device 300, the laterally grown compound semiconductor layers 112 include defect regions 130 containing defects, in addition to the defect regions 120 of the electronic device 200. The arrangement of the defect regions 130 is controlled by defect cores that are Conned at prescribed intervals on the insulating films 104 or the seed surfaces of the second seed compound semiconductors 110.

The defect cores can be generated by forming physical grooves or the like in the seed surfaces or the insulating films 104, for example. These physical grooves can be formed by mechanical scratching, friction, ion implantation, or the like. Here, the prescribed intervals are designed according to the objective of the electronic device 300, and may include, for example, Conning a plurality of defect cores at uniform intervals, forming the defect cores at regular intervals, and forming the defect cores at periodic intervals.

The defect regions 120 and 130 are regions that include many defects, are Conned intentionally on the laterally grown compound semiconductor layers 112, and may be Conned during the crystal-growth of the laterally grown compound semiconductor layers 112. By forming the delect regions 120, the defects of the laterally grown compound semiconductor layers 112 can be concentrated in the defect regions 120 and 130, thereby decreasing the stress on regions of the laterally grown compound semiconductor layers 112 other than the defect regions 120 and 130, resulting in improved crystallinity. The electronic devices can be formed on the defect-free regions, which are regions other than the defect regions 120 and 130. The term "defect-free regions" refers to regions that include absolutely no defects and to regions with lower defect density than the defect regions 120.

Figure 13:
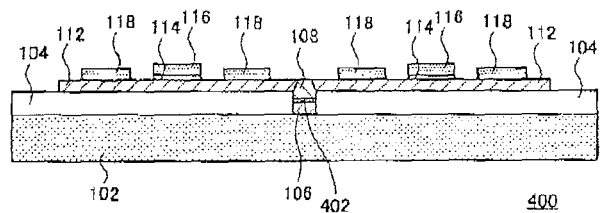
FIG. 13 is an exemplary cross-sectional view of an electronic device 400 according to another embodiment of the present invention.

FIG. 13 is an exemplary cross-sectional view of another electronic device 400 according to an embodiment of the present invention. FIG. 13 is a cross section taken along the line A-A in FIG. 1. Aside from including a buffer layer 402, the electronic device 400 is the same as the electronic device 100.

The buffer layer 402 is formed between the Ge crystal 106 and the first seed compound semiconductor 108. The buffer layer 402 may be a group 3-5 compound semiconductor layer containing P such as an InGaP layer, for example. When an InGaP layer is used as the buffer layer 402, this InGaP layer can be formed by epitaxial growth, for example.

The epitaxial growth of the InGaP layers can be achieved using methods such as MOCVD and MBE, for example. The raw material gas may be TM-Ga (trimethylgallium), TM-In (trimethylindium), or $PH_3$ (phosphine). The epitaxial growth of the InGaP layers involves forming a crystal thin film at a temperature of 650° C., for example. By using the buffer layer 402, the crystallinity of the first seed compound semiconductors 108 was further increased.

Figure 14:
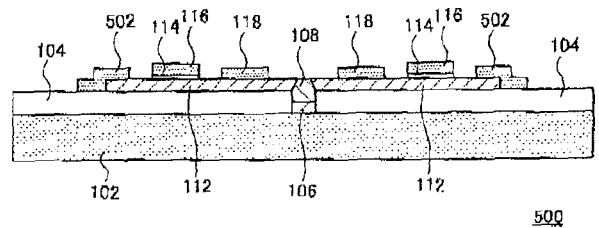
FIG. 14 is an exemplary cross-sectional view of an electronic device 500 according to another embodiment of the present invention.

FIG. 14 is an exemplary cross-sectional view of another electronic device 500 according to an embodiment of the present invention. FIG. 14 is a cross section taken along the line A-A in FIG. 1. Aside from having a different arrangement for the source/drain electrodes 502, the electronic device 500 is the same as the electronic device 100. In the electronic device 500, the MOSFETs, which are examples of active elements, include source/drain electrodes 118 and source/drain electrodes 502.

The source/drain electrodes 502 are examples of first input/output electrodes, and the source/drain electrodes 118 are examples of second input/output electrodes. The source/drain electrodes 502, which are examples of the first input/output electrodes, cover the growth surfaces of the laterally grown compound semiconductor layers 112. In other words, the source/drain electrodes 502 are also formed on side surfaces of the laterally grown compound semiconductor layers 112.

By covering the side surfaces of the laterally grown compound semiconductor layers 112 with the source/drain electrodes 502, the input/output electrodes can be arranged in the movement direction of the carriers in the laterally grown compound semiconductor layers 112 or the active layers formed thereon, i.e. the carrier movement layers. As a result, the carrier movement is easily achieved to increase tire performance of the electronic device 500.

Figure 15:
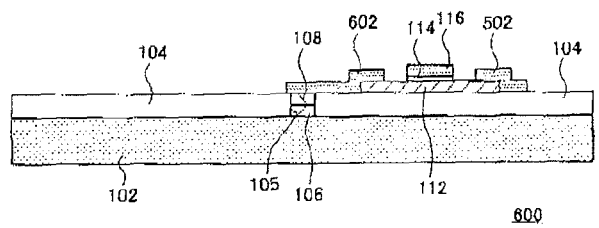
FIG. 15 is an exemplary cross-sectional view of an electronic device 600 according to another embodiment of the present invention.

FIG. 15 is an exemplary cross-sectional view of another electronic device 600 according to an embodiment of the present invention. FIG. 15 is a cross section taken along the line A-A in FIG. 1. Aside from having a different arrangement for the source/drain electrode 602, the electronic device 600 is the same as the electronic device 500. In the electronic device 600, the MOSFET, which is an example of an active element, includes the source/drain electrode 602 and the source/drain electrode 502, The source/drain electrode 602 is an example of the second input/output electrode.

In the electronic device 600, the laterally grown compound semiconductor layer 112 above the open portion 105 is removed by etching. The source/drain electrode 602 covers the side surface of the laterally grown compound semiconductor layer 112 that is exposed by the etching. As a result, the carrier movement is more easily achieved to further increase the performance of the electronic device 600. When forming the Ge crystal 106 by etching a Ge film and then forming the insulating films 104 in regions other than the region where the Ge crystal 106 is formed, the open portion 105 is understood to be the region in which the Ge crystal 106 is formed.

Furthermore, the source/drain electrode 602 is connected to the silicon wafer 102 via the Ge crystal 106 or the first seed compound semiconductor 108 of the open portion 105 exposed by the etching. As a result, one of the input/output terminals of the MOSFET is kept at the wafer potential, thereby achieving effects such as reducing noise, for example.

Figure 16:
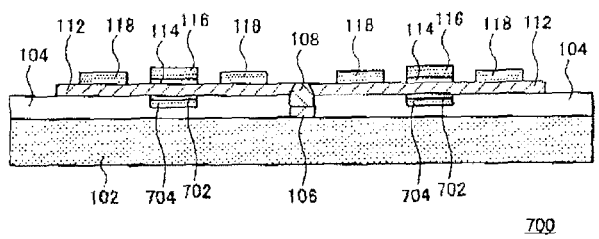
FIG. 16 is an exemplary cross-sectional view of an electronic device 700 according to another embodiment of the present invention.

FIG. 16 is an exemplary cross-sectional view of another electronic device 700 according to an embodiment of the present invention. FIG. 16 is a cross section taken along the line A-A in FIG. 1. Aside from having lower gate insulating films 702 and lower gate electrodes 704, the electronic device 700 is the same as the electronic device 100. In the electronic device 700, the MOSFETs, which are examples of active elements, include the lower gate electrodes 704 and the gate electrodes 116 to control the voltage or current between the input and output.

The gate electrodes 116 and the lower gate electrodes 704 are examples of control electrodes. The lower gate electrodes 704 are arranged between the insulating films 104 and the laterally grown compound semiconductor layers 112, and the gate electrodes 116 are arranged on the sides of the laterally grown compound semiconductor layers 112 that are opposite the insulating films 104. The gate electrodes 116 and the lower gate electrodes 704 are formed facing each other.

By arranging the gate electrodes 116 and the lower gate electrodes 704 in the electronic device 700 in this way, a double gate configuration can be easily achieved. With a double gate configuration, the controlling ability of the gates is increased, thereby improving the switching performance and the like of the electronic device 700.

(First Embodiment)

A silicon wafer having a (100) surface as a principal surface was prepared as the silicon wafer 102, and an SiO$_2$ film was formed on the silicon wafer as the insulating film 104. Openings reaching the principal surface of the silicon wafer were formed in the SiO$_2$ film, and Ge crystals were formed on the principal surface of the silicon wafer exposed by the openings, by CVD using monogermane as the raw material. GaAs crystals serving as the seed compound semiconductors were formed on the Ge crystals by MOCVD using trimethylgallium and arsine as raw material. The growth of the GaAs crystals involved performing low-temperature growth at 550° C. and then performing growth at a temperature of 640° C. The arsine pressure during the growth at 640° C. was 0.05 kPa.

Figure 17:
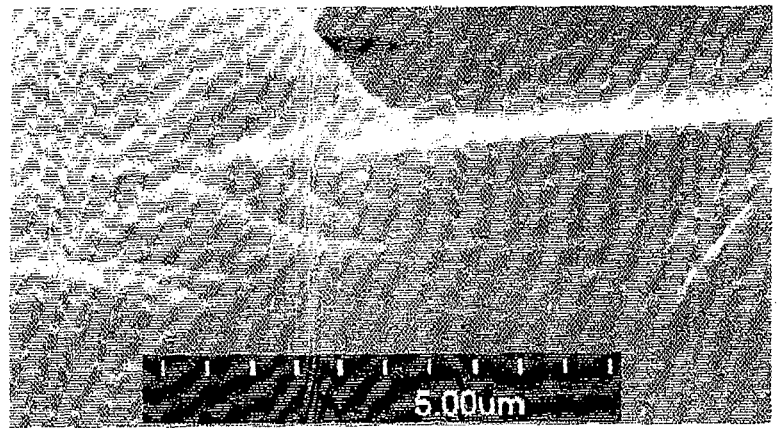
FIG. 17 is a scanning electron microscope image of a cross-section of a crystal.
Figure 18:
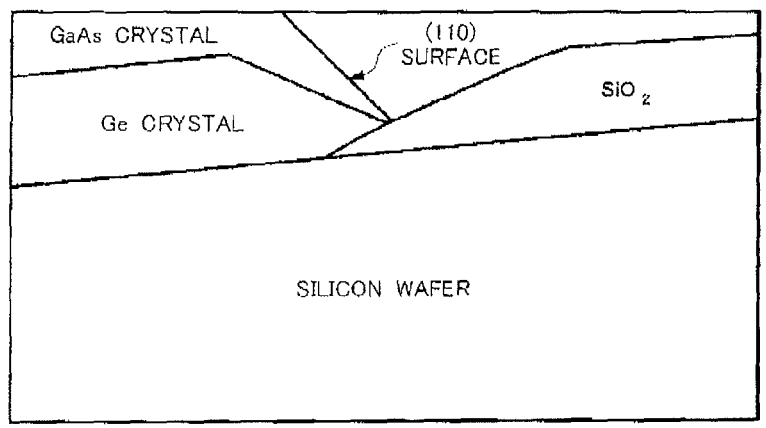
FIG. 18 is a schematic view showing the image of FIG. 17 in a manner that is easier to see.

FIG. 17 is a scanning electron microscope image of a cross-section of the crystal obtained as described above. FIG. 18 is a schematic view showing the image of FIG. 17 in a manner that is easier to sec. Based on this image, it can be confirmed that the GaAs crystal has grown on the Ge crystal. Furthermore, it can be confirmed that the (110) surface has appeared as the seed surface of the GaAs crystal.

Next, a GaAs layer was grown as the laterally grown compound semiconductor layer. The temperature during lateral growth was 640° C. and the ursine pressure was 0.43 kPa.

Figure 19:
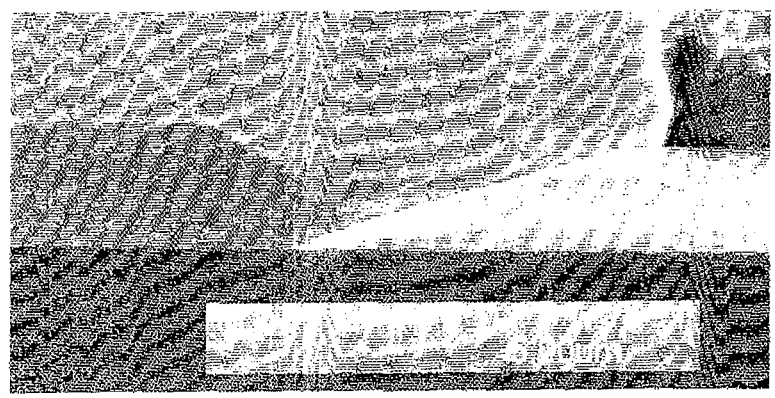
FIG. 19 is a scanning electron microscope image of a cross-section of a crystal.
Figure 20:
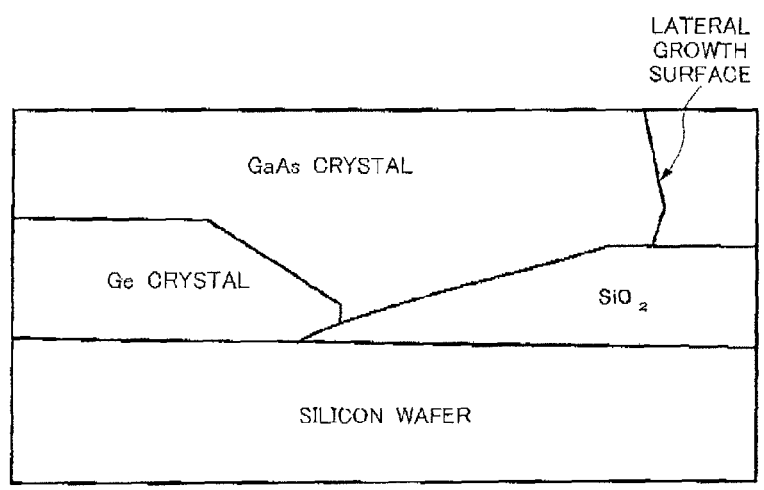
FIG. 20 is a schematic view showing the image of FIG. 19 in a manner that is easier to sec.

FIG. 19 is a scanning electron microscope image of a cross-section of the crystal obtained as described above. FIG. 20 is a schematic view showing the image of FIG. 19 in a manner that is easier to sec. Based on this image, it can be confirmed that the GaAs crystal has a lateral growth surface on the SiO$_2$ film, and that the GaAs crystal has laterally grown on the SiO$_2$ film. The laterally grown portion is a defect-free region, and so a high-performance electronic device can be formed by Conning the electronic device on the laterally grown portion.

(Second Embodiment)

In the same manner as in the First Embodiment, tie crystals were selectively grown on a silicon wafer to form a semiconductor wafer. Cycle annealing was performed on the semiconductor wafer with 10 repeated exposures to temperatures of 800° C. and 680° C. The element concentration of Ge and Si at the interface between a Ge crystal and the silicon wafer in the resulting semiconductor wafer (referred to hereinafter as "Sample A") was analyzed using energy dispersion fluorescent X-ray analysis (referred to hereinafter as "EDX"). In a similar manner, a semiconductor wafer formed by selectively growing Ge crystals on a silicon wafer was formed without undergoing the cycle annealing (this semiconductor wafer is referred to hereinafter as "Sample B"), and was evaluated using EDX in the same manner as Sample A.

Figure 21:
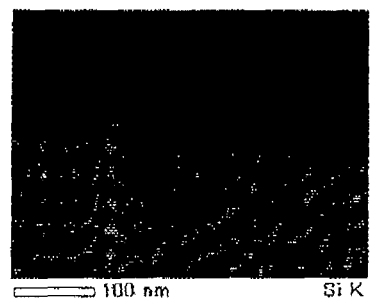
FIG. 21 shows a profile of Si atoms in Sample A.
Figure 22:
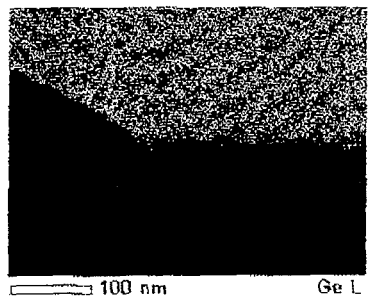
FIG. 22 shows a profile of Ge atoms in Sample A.
Figure 23:
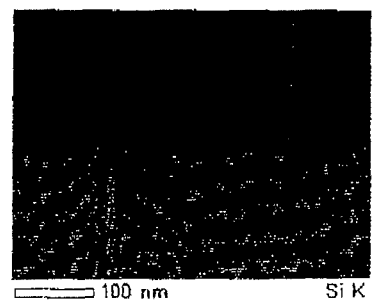
FIG. 23 shows a profile of Si atoms in Sample B.
Figure 24:
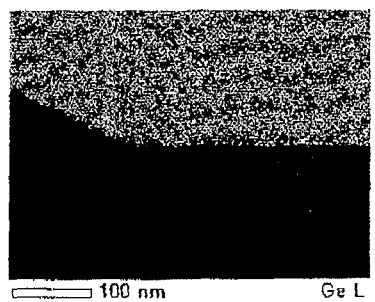
FIG. 24 shows a profile of Ge atoms in Sample B.
Figure 25:
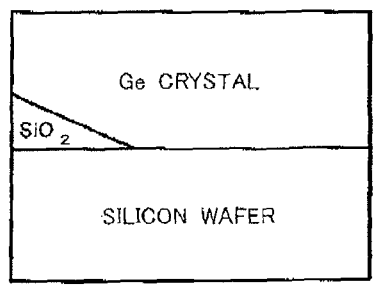
FIG. 25 is a schematic view showing the images of FIGS. 21 to 24 in a manner that is easier to see.

FIG. 21 shows a profile of Si atoms in Sample A. FIG. 22 shows a profile of Ge atoms in Sample A. FIG. 23 shows a profile of Si atoms in Sample B. FIG. 24 shows a profile of Ge atoms in Sample B. FIG. 25 is a schematic view showing the images of FIGS. 21 to 24 in a manner that is easier to see. In Sample B the interface between the silicon wafer and the Ge crystal has a steep slope, while in Sample A this interface is blurred, from which it can be confirmed that the Ge is dispersed into the silicon wafer.

Figure 26:
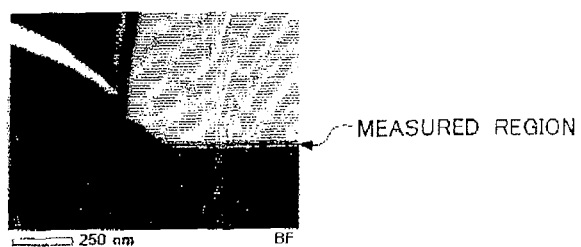
FIG. 26 is an SEM image showing the measured region of Sample A.

The measurement of the Si and Ge clement intensity integrated values was limited to measured regions at the interface between the silicon wafer and the Ge crystal in Sample A and Sample B, FIG. 26 is an SEM image showing the measured region of Sample A. In the SEM image of FIG. 26, the measured region for the element intensity integrated value is a position at which Ge Crystal is present on the silicon wafer, namely a region that is 10 nm to 15 nm away from the interface between the silicon wafer and the Ge crystal, i.e. the interface seen in the SEM image, in a direction of the silicon wafer.

Figure 27:
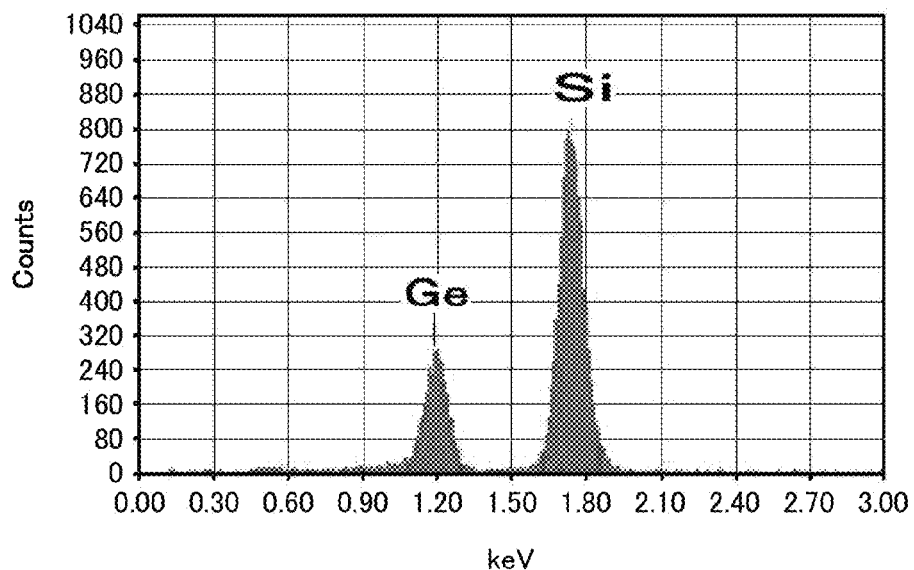
FIG. 27 shows the element intensity integrated value of the Si and Ge in the measured region shown in FIG. 26.
Figure 28:
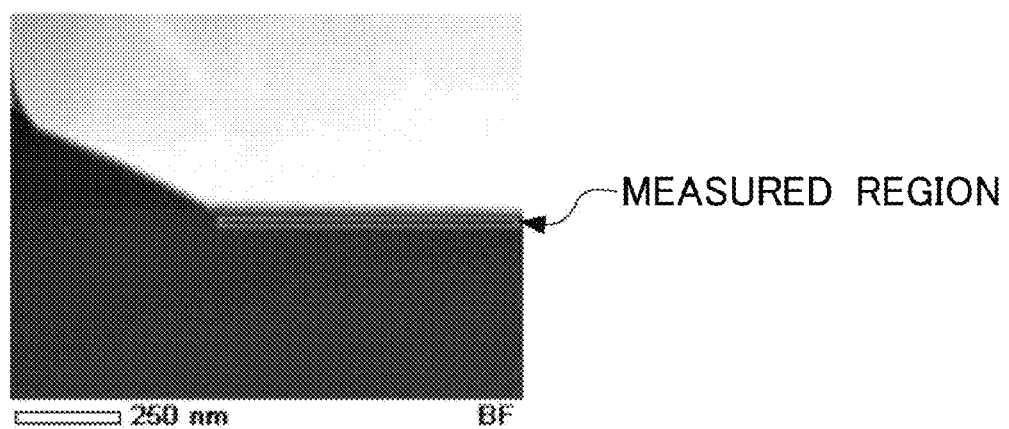
FIG. 28 is an SEM image showing the measured region of Sample 13.
Figure 29:
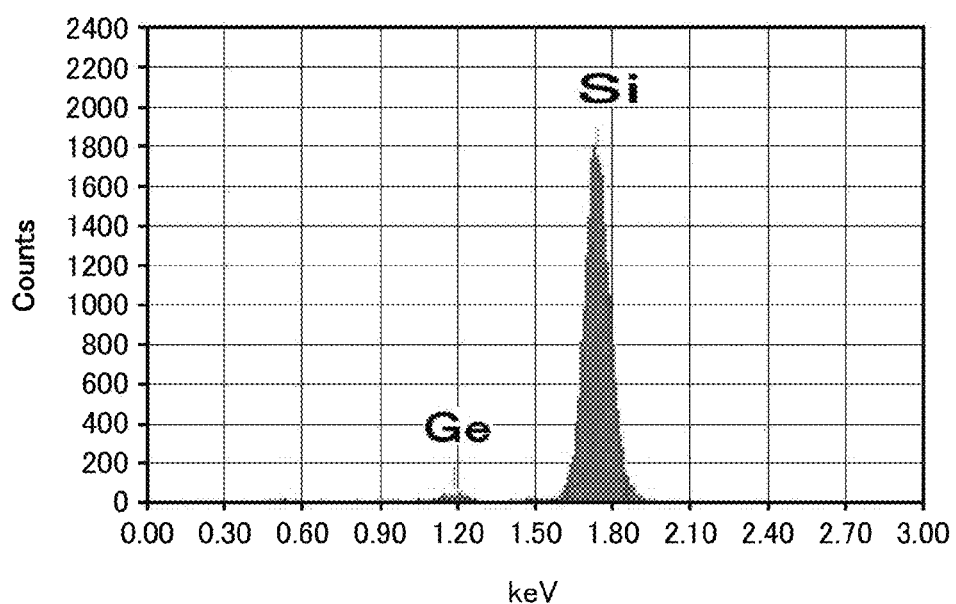
FIG. 29 shows the element intensity integrated value of the Si and Ge in the measured region shown in FIG. 28.

FIG. 27 shows the clement intensity integrated value of the Si and Ge in the measured region shown in FIG. 26. FIG. 28 is an SEM image showing the measured region of Sample B. FIG. 29 shows the element intensity integrated value of the Si and Ge in the measured region shown in FIG. 28. In Sample B, the Ge signal is barely detected and the Si signal is dominant, while in Sample A, the Ge signal is relatively strong. Therefore, it is understood that the Ge in Sample A is dispersed in the silicon wafer.

When the depth profile of the Si atoms in the region where the silicon wafer and the SiO₂ film contact is plotted, the position at which the total intensity of the Si in the silicon wafer and the Si in the SiO₂ film is 50% is determined to be the interface between the silicon wafer and the Ge crystal, and the element intensity ratio for each of the Ge and the Si is measured in a range that is from 5 nm to 10 nm away from the interface in the direction of the silicon wafer. From these element intensity ratios, the integrated value in the depth direction for each element and the ratio (Ge/Si) of the integrated values were calculated.

The results were a ratio of 3.33 in Sample A and 1.10 in Sample B. Therefore, the average Ge concentration in the range that is from 5 nm to 10 nm away from the interface between the silicon wafer and the Ge crystal in the direction of the silicon wafer was calculated to be 77% in Sample A and 52% in Sample B. Upon observing dislocation in Sample A and Sample B using a transmission electron microscope, dislocation reaching the Ge crystal surface was not seen in Sample A. On the other hand, in Sample B, dislocation reaching the crystal surface with a density of approximately $1 \times 10^9$ cm$^{-2}$ was seen. Based on the above results, application of cycle annealing was confirmed as decreasing the dislocation of the Ge crystal.

(Third Embodiment)

MOCVD was used to grow the GaAs crystal on the Ge crystal on which cycle annealing was performed in the same manner as in Sample A of the Second Embodiment, and a multi-layer film made of GaAs layers find InGaP layers was formed on the GaAs crystal to obtain Sample C. Sample D was obtained by Conning a multi-layer film and the GaAs crystal in the same manner as above, except that post annealing was performed on the Ge crystal.

The EDX measurement described in the Second Embodiment was performed on Sample C and Sample D to measure the element intensity ratio for each of the Ge and the Si in the range that is from 5 nm to 10 nm away from the interface between the silicon wafer and the Ge crystal in the direction of the silicon wafer. The integrated value in the depth direction and the ratio (Ge/Si) of the integrated values were calculated for the Ge and the Si. This ratio was 2.28 in Sample C and 0.60 in Sample D. Therefore, the average Ge concentration in the range that is from 5 nm to 10 nm away from the interface between the silicon wafer and the Ge crystal in the direction of the silicon wafer was calculated to be 70% in Sample C and 38% in Sample D.

Upon observing dislocation in Sample C and Sample D using a transmission electron microscope, dislocation reaching the multi-layer film made up of the GaAs layer and the InGaP layer was not seen in Sample C, while dislocation reaching the multi-layer film made up of the GaAs layer and the InGaP layer was seen in Sample D. Therefore, it is understood that, when the average Ge concentration in the range that is from 5 nm to 10 nm away from the interface between the silicon wafer and the Ge crystal in the direction of the silicon wafer is 60% or more, a higher-quality compound semiconductor layer can be formed on the Ge crystal. A more preferable average Ge concentration is 70% or more.

The above describes a MOSFET (metal-oxide-semiconductor field-effect transistor) as an example of the electronic device. However, the electronic device is not limited to a MOSFET, and can instead be an HEMT (High Electron Mobility Transistor), a pseudomorphic-HEMT, or the like. The electronic device 100 may also be a MESFET (Metal-Semiconductor Field Effect Transistor).

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The invention claimed is:

1. A semiconductor wafer comprising:
   a silicon wafer;
   an insulating film that is formed on the silicon wafer and that has an open portion reaching the silicon wafer;
   a nucleus Ge crystal formed in the open portion;
   a seed compound semiconductor crystal that is grown on top of the Ge crystal and that protrudes beyond a top surface of the insulating film; and
   a laterally grown compound semiconductor layer that is laterally grown on the insulating film with a specified surface of the seed compound semiconductor crystal as a seed surface.

2. The semiconductor wafer according to claim 1, wherein the open portion has an aspect ratio of √3/3 or more.

3. A semiconductor wafer comprising:
   a silicon wafer;
   a nucleus Ge crystal that is formed by etching a Ge film deposited on the silicon wafer; an insulating film that is formed on the silicon wafer in a region other than a region in which the Ge crystal is formed;
   a seed compound semiconductor crystal that is grown on top of the Ge crystal and that protrudes beyond a top surface of the insulating film; and
   a laterally grown compound semiconductor layer that is laterally grown on the insulating film with a specified surface of the seed compound semiconductor crystal as a seed surface.

4. The semiconductor wafer according to claim 1, wherein maximum width of the Ge crystal in a direction parallel to a top surface of the silicon wafer is no greater than 5 μm.

5. The semiconductor wafer according to claim 1, wherein the Ge crystal or the seed compound semiconductor crystal is annealed to have decreased defect density.

6. The semiconductor wafer according to claim 1, wherein the silicon wafer and the Ge crystal are in contact with each other, and
   the silicon wafer includes therein an $Si_{1-x}Ge_x$ layer ($0<x<1$) that contacts an interface between the silicon wafer and the Ge crystal.

7. The semiconductor wafer according to claim 6, wherein average composition x of Ge in a region that is from 5 nm to 10 nm away from the interface between the silicon wafer and the Ge crystal is 60% or more.

8. The semiconductor wafer according to claim 1, wherein the seed compound semiconductor crystal includes a first seed compound semiconductor that is formed on the Ge crystal to protrude beyond the top surface of the insulating film and a second seed compound semiconductor that is laterally grown on the insulating film with a specified surface of the first seed compound semiconductor as a nucleus, and
   the seed surface is a specified surface of the second seed compound semiconductor.

9. The semiconductor wafer according to claim 1, wherein the laterally grown compound semiconductor layer includes defect regions that contain defects, and
   arrangement of the defect regions is controlled by defect cores formed at prescribed intervals on the insulating film or on the seed surface.

10. The semiconductor wafer according to claim 1, wherein
the laterally grown compound semiconductor layer includes defect regions that contain defects, and
arrangement of the defect regions is controlled by forming a plurality of the Ge crystals at prescribed intervals.

11. The semiconductor wafer according to claim 1, wherein
a plurality of the Ge crystals are formed on the silicon wafer and a plurality of the laterally grown compound semiconductor layers are crystal-grown with the Ge crystals as nuclei to be separated from each other on the insulating film.

12. The semiconductor wafer according to claim 1, wherein a group 3-5 compound semiconductor layer containing P is formed between the Ge crystal and the seed compound semiconductor crystal.

13. The semiconductor wafer according to claim 1, wherein the laterally grown compound semiconductor layer includes a group 2-6 compound semiconductor or a group 3-5 compound semiconductor.

14. A semiconductor wafer comprising:
a silicon wafer;
an insulating film that is formed on the silicon wafer and that has an opening therein that reaches the silicon wafer;
a nucleus Ge crystal formed in the opening;
a compound semiconductor crystal that is grown on top of the Ge crystal and that is formed to protrude beyond a top surface of the insulating film; and
a laterally grown compound semiconductor that is laterally grown on the insulating film with the compound semiconductor crystal as a seed.

15. A semiconductor wafer comprising:
a silicon wafer;
a nucleus Ge crystal that is formed by etching a Ge film deposited on the silicon wafer;
an insulating film that is formed on the silicon wafer in a region other than a region in which the Ge crystal is formed;
a compound semiconductor crystal that is grown on top of the Ge crystal and that protrudes beyond a top surface of the insulating film; and
a laterally grown compound semiconductor that is laterally grown on the insulating film with the compound semiconductor crystal as a seed.

16. An electronic device comprising:
a silicon wafer;
an insulating film that is formed on the silicon wafer and that has an open portion reaching the silicon wafer;
a nucleus Ge crystal formed in the open portion;
a seed compound semiconductor crystal that is grown on top of the Ge crystal and that protrudes beyond a top surface of the insulating film;
a laterally grown compound semiconductor layer that is laterally grown on the insulating, film with a specified surface of the seed compound semiconductor crystal as a seed surface; and
an active element that has an active region and that is formed on a defect-free region of the laterally grown compound semiconductor layer.

17. The electronic device according to claim 16, wherein the active element has a first input/output electrode and a second input/output electrode,
the laterally grown compound semiconductor layer above the open portion is removed by etching, and
the second input/output electrode covers a side surface of the laterally grown compound semiconductor layer that is exposed by the etching.

18. The electronic device according to claim 17, wherein the second input/output electrode is connected to the silicon wafer via the Ge crystal or the seed compound semiconductor crystal in the open portion exposed by the etching.

19. An electronic device comprising:
a silicon wafer;
a nucleus Ge crystal that is formed by etching a Ge film deposited on the silicon wafer; an insulating film that is formed on the silicon wafer in a region other than a region in which the Ge crystal is formed;
a seed compound semiconductor crystal that is grown on top of the Ge crystal and that protrudes beyond a top surface of the insulating film;
a laterally grown compound semiconductor layer that is laterally grown on the insulating film with a specified surface of the seed compound semiconductor crystal as a
seed surface; and an active element that has an active region and that is formed on a defect-free region of the laterally grown compound semiconductor layer.

20. The electronic device according to claim 19, wherein the active element has a first input/output electrode and a second input/output electrode,
the laterally grown compound semiconductor layer in a region where the Ge crystal is formed is removed by etching, and
the second input/output electrode covers a side surface of the laterally grown compound semiconductor layer that is exposed by the etching.

21. The electronic device according to claim 20, wherein the second input/output electrode is connected to the silicon wafer via the Ge crystal or the seed compound semiconductor crystal exposed by the etching in the region where the Ge crystal is formed.

22. The electronic device according to claim 16, wherein the active, element has a first input/output electrode and a second input/output electrode, and
the first input/output electrode covers a growth surface of the laterally grown compound semiconductor layer.

23. The electronic device according to claim 16, wherein the active element has control electrodes that control voltage or current between input and output, and
the control electrodes are formed (i) between the insulating film and the laterally grown compound semiconductor layer and (ii) on a side of the laterally grown compound semiconductor layer that is opposite the insulating film, in a manner to face each other.

24. The electronic device according to claim 16, wherein a plurality of the active elements are connected to each other.

25. The electronic device according to claim 16, wherein the silicon wafer and the Ge crystal contact each other, and the silicon wafer contains an $Si_{1-x}$, $Ge_x$, layer ($0<x<1$) contacting an interface between the silicon wafer and the Ge crystal.

26. The electronic device according to claim 25, wherein average Ge composition x is 60% or greater in a region that is between 5 nm and 10 nm away from the interface between the silicon wafer and the Ge crystal.

27. An electronic device comprising:
a silicon wafer;
an insulating film that is formed on the silicon wafer and that has an opening therein that reaches the silicon wafer;

a nucleus Ge crystal formed in the opening;
a compound semiconductor crystal that is grown on top the Ge crystal and that is formed to protrude beyond a top surface of the insulating film;
a laterally grown compound semiconductor that is laterally grown on the insulating film with the compound semiconductor crystal as a seed; and
an active element that has an active region on the laterally grown compound semiconductor.

28. An electronic device comprising:
a silicon water;
a nucleus Ge crystal that is formed by etching a Ge film deposited on the silicon wafer;
an insulating film that is formed on the silicon wafer in a region other than a region in which the Ge crystal is formed;
a compound semiconductor crystal that is grown on top of the Ge crystal and that protrudes beyond a top surface of the insulating film;
a laterally grown compound semiconductor that is laterally grown on the insulating film with the compound semiconductor crystal as a seed; and
an active element that has an active region on the laterally grown compound semiconductor.

* * * * *